United States Patent
Lee

(10) Patent No.: US 8,492,782 B2
(45) Date of Patent: *Jul. 23, 2013

(54) SEMICONDUCTOR LIGHT EMITTING DEVICE

(75) Inventor: Sang Youl Lee, Gwangju (KR)

(73) Assignee: LG Innotek Co., Ltd., Seoul (KR)

( * ) Notice: Subject to any disclaimer, the term of this patent is extended or adjusted under 35 U.S.C. 154(b) by 47 days.

This patent is subject to a terminal disclaimer.

(21) Appl. No.: 13/112,322

(22) Filed: May 20, 2011

(65) Prior Publication Data

US 2011/0284823 A1   Nov. 24, 2011

Related U.S. Application Data

(63) Continuation of application No. 12/428,622, filed on Apr. 23, 2009, now Pat. No. 7,973,329.

(30) Foreign Application Priority Data

Apr. 24, 2008  (KR) ................ 10-2008-0038117

(51) Int. Cl.
*H01L 33/00* (2010.01)
*H01L 27/15* (2006.01)
*H01L 31/12* (2006.01)

(52) U.S. Cl.
USPC ........... 257/98; 257/79; 257/99; 257/E33.062

(58) Field of Classification Search
USPC .......... 257/79, 98, 99, 81, E33.062, E33.065, 257/E33.066
See application file for complete search history.

(56) References Cited

U.S. PATENT DOCUMENTS

| 6,462,358 | B1 | 10/2002 | Lin et al. |
| 6,838,704 | B2 | 1/2005 | Lin et al. |
| 7,348,601 | B2 | 3/2008 | Hata |
| 7,679,097 | B2 | 3/2010 | Akaishi |
| 7,973,329 | B2 * | 7/2011 | Lee ............................ 257/98 |
| 2006/0124954 | A1 | 6/2006 | Akaishi |
| 2007/0085091 | A1 | 4/2007 | Lee |
| 2007/0284602 | A1 | 12/2007 | Chitnis et al. |
| 2009/0045433 | A1 | 2/2009 | Osawa et al. |

FOREIGN PATENT DOCUMENTS

| DE | 100 44 500 A1 | 4/2002 |
| EP | 0 905 797 A2 | 3/1999 |
| EP | 1 653 523 A2 | 5/2006 |

(Continued)

OTHER PUBLICATIONS

English-language Translation of JP 10-93186.

*Primary Examiner* — Shouxiang Hu
(74) *Attorney, Agent, or Firm* — Birch, Stewart, Kolasch & Birch, LLP

(57) ABSTRACT

A semiconductor light emitting device, including a reflective electrode layer; a second conductive semiconductor layer formed on a portion of a top surface of the reflective electrode layer; an active layer formed on the second conductive semiconductor layer; a first conductive semiconductor layer formed on the active layer; a first electrode formed under one portion of the first conductive semiconductor layer; and an insulating layer having a lower portion, a first upwardly directed side wall portion at a first side of the first electrode and a second upwardly directed side wall portion at a second side of the first electrode that is opposite to the first side. At least one portion of the lower portion is between the second conductive semiconductor layer and the reflective electrode layer.

19 Claims, 4 Drawing Sheets

FOREIGN PATENT DOCUMENTS

| | | |
|---|---|---|
| JP | 10-93186 A | 4/1998 |
| JP | 10-163530 A | 6/1998 |
| JP | 11-330622 A | 11/1999 |
| JP | 2006-073619 A | 3/2006 |
| JP | 2006-278554 A | 10/2006 |
| JP | 2007-110056 A | 4/2007 |
| KR | 10-2005-0104750 A | 11/2005 |
| WO | WO 2008/131735 A1 | 11/2008 |

* cited by examiner

SEMICONDUCTOR LIGHT EMITTING DEVICE

CROSS-REFERENCE TO RELATED APPLICATIONS

This application is a Continuation of U.S. patent application Ser. No. 12/428,622 filed on Apr. 23, 2009, now U.S. Pat. No. 7,973,329, which claims priority to Korean Patent Application No. 10-2008-0038117 (filed on Apr. 24, 2008), which is hereby incorporated by reference in its entirety.

BACKGROUND OF THE INVENTION

1. Field of Invention

The present disclosure relates to a semiconductor light emitting device.

2. Discussion of the Related Art

Group III-V nitride semiconductors have been variously applied to an optical device such as blue and green Light Emitting Diodes (LED), a high speed switching device such as a Metal Oxide Semiconductor Field Effect Transistor (MOSFET) and a High Electron Mobility Transistor (HEMT), and a light source of a lighting device or a display device. Particularly, light emitting device using a group III nitride semiconductor has a direct transition bandgap corresponding to a region from visible rays to ultraviolet and can realize high-efficiency light radiation.

The nitride semiconductor is mainly used for an LED or a Laser Diode (LD), and studies have been continuously conducted to improve the manufacturing process or light efficiency of the nitride semiconductor.

SUMMARY OF THE INVENTION

Embodiments provide a semiconductor light emitting device which comprises a second electrode layer under a plurality of compound semiconductor layers and a first electrode in the outer side thereof.

Embodiments provide a semiconductor light emitting device which comprises a second electrode layer disposed under a light emitting structure, an insulator disposed on the one side of the second electrode layer and a first electrode disposed on the insulator.

An embodiment provides a semiconductor light emitting device comprising: a first conductive semiconductor layer; an active layer under the first conductive semiconductor layer; a second conductive semiconductor layer under the active layer; a second electrode layer under the second conductive semiconductor layer; an insulator on one side of the second electrode layer; and a first electrode electrically connected to a one end of the first conductive semiconductor layer, on the insulator.

An embodiment provides a semiconductor light emitting device comprising: a light emitting structure comprising a first conductive semiconductor layer, an active layer under the first conductive semiconductor layer, and a second conductive semiconductor layer under the active layer; a second electrode layer under the light emitting structure; a first electrode electrically connected to the first conductive semiconductor layer, in an outer side of the light emitting structure; and an insulator between the first electrode and the second electrode layer.

An embodiment provides a semiconductor light emitting device comprising: a light emitting structure comprising a first conductive semiconductor layer, an active layer under the first conductive semiconductor layer, and a second conductive semiconductor layer under the active layer; a second electrode layer under the second conductive semiconductor layer; an insulator on the second electrode layer and in a one side of the light emitting structure; and a first electrode between the insulator and a one end of the first conductive semiconductor layer.

The details of one or more embodiments are set forth in the accompanying drawings and the description below. Other features will be apparent from the description and drawings, and from the claims.

DETAILED DESCRIPTION OF THE EMBODIMENTS

Reference will now be made in detail to the embodiments of the present disclosure, examples of which are illustrated in the accompanying drawings.

In the following description, it will be understood that when a layer (or film) is referred to as being 'on' another layer or substrate, it can be directly on the another layer or substrate, or intervening layers may also be present. Further, it will be understood that when a layer is referred to as being 'under' another layer, it can be directly under the another layer, and one or more intervening layers may also be present. In addition, it will also be understood that when a layer is referred to as being 'between' two layers, it can be the only layer between the two layers, or one or more intervening layers may also be present.

Figure 1:
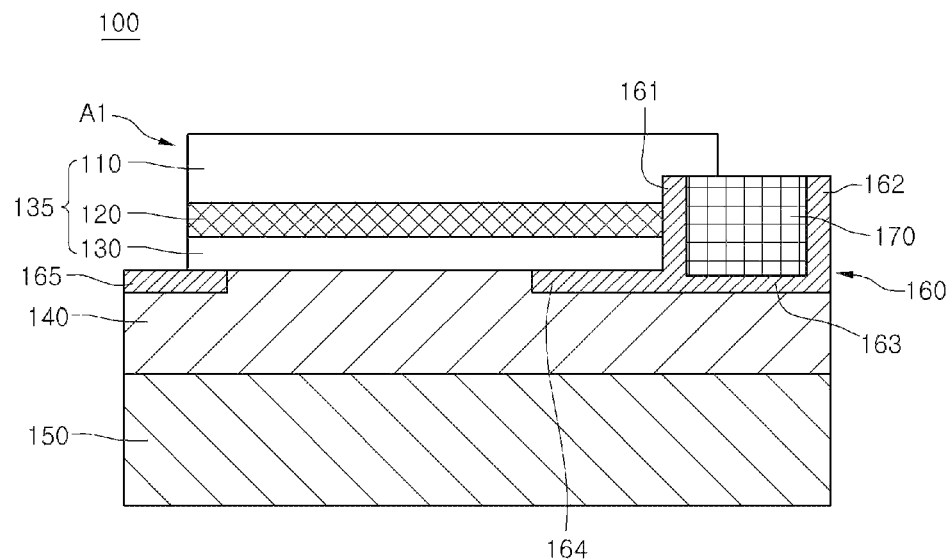
FIG. 1 is a side-sectional view of a semiconductor light emitting device according to one embodiment.
Figure 2:
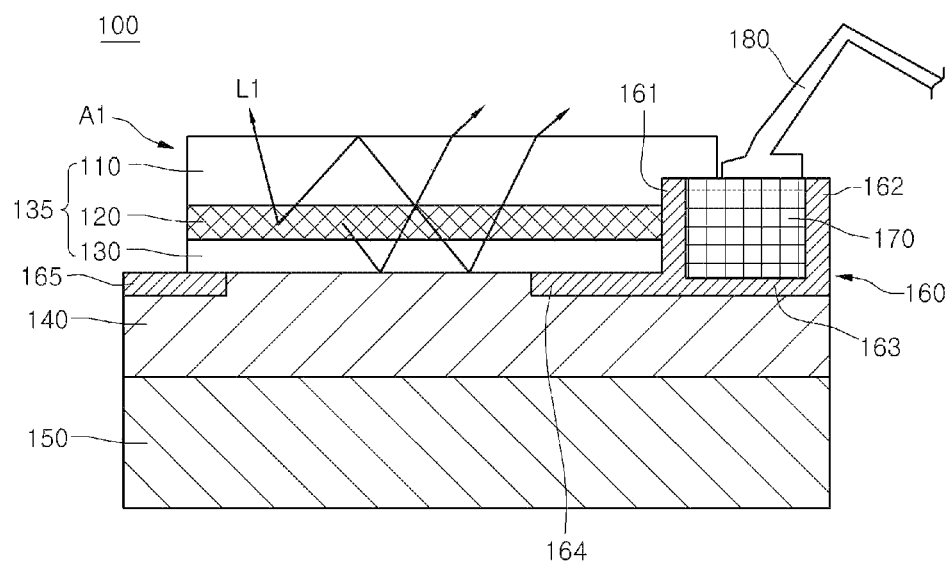
FIG. 2 is a diagram illustrating an example where a wire is bonded with the first electrode of FIG. 1.

FIG. 1 is a side-sectional view of a semiconductor light emitting device according to one embodiment. FIG. 2 is a diagram illustrating an example where a wire is bonded with the first electrode of FIG. 1.

Referring to FIG. 1, a semiconductor light emitting device 100 comprises a first conductive semiconductor layer 110, an active layer 120, a second conductive semiconductor layer 130, a second electrode layer 140, a conductive support member 150, an insulator 160, and a first electrode 170.

The semiconductor light emitting device 100 comprises a Light Emitting Diodes (LED) using a group III-V compound semiconductor. The LED may be a chromatic LED emitting chromatic light such as blue light, red light or green light, or may be an ultraviolet (UV) LED. The emission light of the LED may be variously implemented in the spirit and scope of embodiments.

The first conductive semiconductor layer 110 may be selected from the compound semiconductors of group III-V elements (on which a first conductive dopant is doped), for example, GaN, AlN, AlGaN, InGaN, InN, InAlGaN, AlInN, AlGaAs, GaP, GaAs and GaAsP.

When the first conductive semiconductor layer 110 is an N-type semiconductor layer, the first conductive dopant comprises an N-type dopant such as Si, Ge, Sn, Se and Te. The first conductive semiconductor layer 110 may serve as an electrode contact layer and may be formed in a single layer or multi layers, but is not limited thereto.

The first electrode 170 is electrically connected to the one end 115 of the first conductive semiconductor layer 110. The first electrode 170 may be disposed under the one end 115 of the first conductive semiconductor layer 110, or may be disposed in a line at an outer side. A power supply source having a first polarity is applied to the first electrode 170. Herein, a roughness (not shown) of a certain shape may be formed on the entire surface of the first conductive semiconductor layer 110, and may be added or modified in the spirit and scope of embodiments.

Moreover, a translucent electrode layer (not shown) may be formed on the first conductive semiconductor layer 110, and diffuses the power supply source having the first polarity applied by the first electrode 170 to an entire region. The translucent electrode layer may comprise at least one of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IrOx, RuOx, RuOx/ITO, Ni/IrOx/Au and Ni/IrOx/Au/ITO.

The active layer 120 is formed under the first conductive semiconductor layer 110, and the active layer 120 may be formed in a single quantum well structure or a multiple quantum well structure. The active layer 120 may form the period of a well layer and a barrier layer, for example, the period of an InGaN well layer/GaN barrier layer or the period of an AlGaN well layer/GaN barrier layer by using the compound semiconductor materials of group III-V elements.

The active layer 120 may be formed of a material having a bandgap energy according to the wavelength of an emitting light. The active layer 120 may comprise a material that emits a chromatic light such as a light having a blue wavelength, a light having a red wavelength and a light having a green wavelength, but is not limited thereto. A conductive clad layer may be formed on and/or under the active layer 120, and may be formed in an AlGaN layer.

The second conductive semiconductor layer 130 is formed under the active layer 120, and may be formed of at least one of the compound semiconductors of group III-V elements (on which a second conductive dopant is doped), for example, GaN, AlN, AlGaN, InGaN, InN, InAlGaN, AlInN, AlGaAs, GaP, GaAs and GaAsP. When the second conductive semiconductor layer 130 is a P-type semiconductor layer, the second conductive dopant may comprise a P-type dopant such as Mg and Ze. The second conductive semiconductor layer 130 may serve as an electrode contact layer and may be formed in a single layer or multi layers, but is not limited thereto.

Herein, the first conductive semiconductor layer 110, the active layer 120 and the second conductive semiconductor layer 130 may be defined as a light emitting structure 135. Moreover, the first conductive semiconductor layer 110 may be formed of a P-type semiconductor, and the second conductive semiconductor layer 130 may be formed of an N-type semiconductor. A third conductive semiconductor layer, for example, an N-type semiconductor layer or a P-type semiconductor layer, may be formed under the second conductive semiconductor layer 130. Accordingly, the light emitting structure 135 may comprise at least one of an N—P junction structure, a P—N junction structure, an N—P—N junction structure and a P—N—P junction structure.

The second electrode layer 140 is formed under the second conductive semiconductor layer 130. The second electrode layer 140 may be formed of a reflection electrode material, or may be formed of at least one of Ag, Ni, Al, Rh, Pd, Ir, Ru, Mg, Zn, Pt, Au, Hf and a material consisting of their selective combination. Herein, the reflection electrode material may be composed of a material having characteristic where a reflection rate is equal to or higher than 50%.

An ohmic contact layer (not shown), in which a plurality of patterns are formed in a matrix shape or/and a layer type, may be formed in the second electrode layer 140. The ohmic contact layer comprises at least one of materials such as ITO, IZO, AZO, IZTO, IAZO, IGZO, IGTO and ATO.

Herein, the second electrode layer 140 may be schottky/ohmic contacted to the second conductive semiconductor layer 130. When the ohmic contact layer exists, the second electrode layer 140 is schottky contacted to the second conductive semiconductor layer 130, and the ohmic contact layer is ohmic contacted to the second conductive semiconductor layer 130. Accordingly, the second electrode layer 140 and the ohmic contact layer may divide a current applied to the second conductive semiconductor layer 130 because they have different electrical characteristics.

The second electrode layer 140 serves as an electrode which stably provides a power supply source having a second polarity to the light emitting structure 135, and reflects light incident though the second conductive semiconductor layer 130.

The conductive support member 150 is formed under the second electrode layer 140. The conductive support member 150 may be formed of at least one of copper (Cu), gold (Au), nickel (Ni), molybdenum (Mo), copper-tungsten (Cu—W) and carrier wafer (for example, Si, Ge, GaAs, ZnO, SiC and the like). The conductive support member 150 may be formed in an electro plating process, but is not limited thereto.

The second electrode layer 140 and the conductive support member 150 may be used as a second electrode member which provides the power supply source having the second polarity to the light emitting structure 135, and the second electrode member may be formed in a single layer or multi layers. Herein, the second electrode member having the single layer may be attached under the second conductive semiconductor layer 130 with adhesives.

An etched region A1 exists in the outer side of the light emitting structure 135, which may be disposed more inward than the edge of the second electrode layer 140.

The first electrode 170 is insulated from the layers 120, 130 and 140 by the insulator 160, and is electrically connected to the first conductive semiconductor layer 110. The first electrode 170 may be formed of at least one of Ti, Al, In, Ta, Pd, Co, Ni, Si, Ge, Ag and Au, but is not limited thereto.

The insulator 160 comprises side wall portions 161 and 162, a base portion 163, and a support portion 164. The insulator 160 may be formed of at least one of $SiO_2$, $Si_3N_4$, $Al_2O_3$ and $TiO_2$. The side wall portions 161 and 162 of the insulator 160 are formed in the outer surface of the first electrode 170, and may be formed in a circle or polygon shape. In this case, the first electrode 170 may be formed in a circle or polygon shape.

The inner side wall portion 161 of the side wall portions 161 and 162 is disposed between the first electrode 170 and the outer side of the second conductive semiconductor layer 130 and the active layer 120, and insulates the inner side surface of the first electrode 170 from the layers 120 and 130. Moreover, the inner side wall portion 161 is extended to the bottom of the one end 115 of the first conductive semiconductor layer 110, and can electrically disconnect the first electrode 170 and the active layer 120. The one end 115 of the first conductive semiconductor layer 110 is formed to partially overlap on the first electrode 170.

The outer side wall portion 162 of the side wall portions 161 and 162 insulates other side surface of the first electrode 170 in the channel region of a chip, and prevents the outer side of the first electrode 170 from being exposed.

The base portion 163 is formed between the first electrode 170 and the second electrode layer 140, and is disposed under the side wall portions 161 and 162. The base portion 163 is formed on the one side of the second electrode layer 140, and electrically insulates the first electrode 170 and the second electrode layer 140.

The support portion 164 extended to the inner side of the base portion 163 is disposed between the second conductive semiconductor layer 130 and the second electrode layer 140, and prevents the insulator 160 from being separated from a chip.

A passivation portion 165 may be formed around the top of the second electrode layer 140. The passivation portion 165 has a ring shape or a belt shape, and may be connected to the base portion 163 of the insulator 160. The material of the passivation portion 165 may be the same as that of the insulator 160. That is, the insulator 160 may further comprise the passivation portion 165.

Moreover, the passivation portion 165 may be formed in a material different from the insulator 160, for example, a conductive material. For example, the passivation portion 165 may comprise at least one of ITO, IZO, AZO, IZTO, IAZO, IGZO, IGTO and ATO. The passivation portion 165 may not be formed.

The passivation portion 165 separates the light emitting structure 135 from the second electrode layer 140, and thus, can prevent influences that are transferred from the second electrode layer 140 to the side wall of the light emitting structure 135.

The first electrode 170 is disposed on the outer side of the light emitting structure 135 and the one side of the second electrode layer 140 by the insulator 160, is electrically connected to the first conductive semiconductor layer 110, and is electrically opened from the layers 120, 130 and 140.

Referring to FIG. 2, a wire 180 is bonded on the first electrode 170. In this case, the wire 180 is connected to the first electrode 170 which is disposed in the outer side of the semiconductor light emitting device 100, and thus, may be disposed outward the semiconductor light emitting device 100.

The power supply source having the first polarity is provided to the first conductive semiconductor layer 110 through the first electrode 170, and the power supply source having the second polarity is provided through the conductive support member 150 and the second electrode layer 140. Light radiated from the active layer 120 of the semiconductor light emitting device 100 is irradiated in a forward direction.

At this point, there is no obstacle in the top of the first conductive semiconductor layer 110, thereby decreasing obstacles that obstructs the traveling of light L1.

For example, if the first electrode is disposed in the top of the first conductive semiconductor layer and a wire is bonded, the following limitations may occur. The first electrode and the wire may serve as obstacles that obstruct a light path extracted to the top of the first conductive semiconductor layer. That is, there may occur limitations that the wire and the first electrode disposed in the upper side of the first conductive semiconductor layer absorb light.

The first electrode 170 is disposed in the side of the semiconductor light emitting device 100, and thus, the wire 180 does not pass though the upper portion of the semiconductor light emitting device 100. Accordingly, light extraction efficiency can be improved.

FIGS. 3 to 8 are diagrams illustrating a process of manufacturing the semiconductor light emitting device according to one embodiment.

Figure 3:
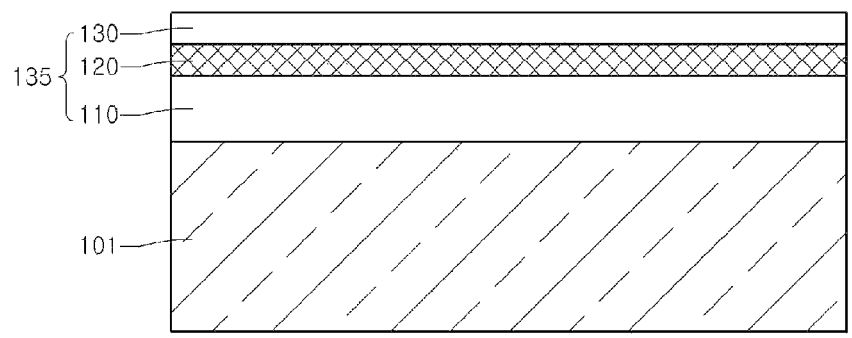
FIGS. 3 to 8 are diagrams illustrating a process of manufacturing the semiconductor light emitting device according to one embodiment.

Referring to FIG. 3, the light emitting structure 135 on which a plurality of compound semiconductor layers are stacked is formed on a substrate 101. The light emitting structure 135 may comprise the first conductive semiconductor layer 110, the active layer 120 and the second conductive semiconductor layer 130 which are sequentially stacked.

The substrate 101 may be selected from the group consisting of sapphire substrate ($Al_2O_3$), GaN, SiC, ZnO, Si, GaP, InP and GaAs. A concave-convex pattern may be formed on the substrate 101, but is not limited thereto.

A group III-V compound semiconductor may grow on the substrate 101. Herein, the growth equipment of the compound semiconductor may be implemented with electron beam evaporator, Physical Vapor Deposition (PVD), Chemical Vapor Deposition (CVD), Plasma Laser Deposition (PLD), dual-type thermal evaporator, sputtering and Metal Organic Chemical Vapor Deposition (MOCVD), but is not limited thereto.

A buffer layer (not shown) or/and an undoped semiconductor layer (not shown) may be formed on the substrate 101. The buffer layer may be formed of a single crystal buffer layer or a group III-V compound semiconductor, and decreases a lattice constant difference with the substrate 110. The undoped semiconductor layer may be formed of a GaN-based semiconductor. The substrate 101, the buffer layer and the undoped semiconductor layer may be separated or removed after the growth of a thin film. Herein, a separate patterned metal material (not shown) may be formed between the substrate 101 and the first conductive semiconductor layer 110 for protecting the active layer 120.

The first conductive semiconductor layer 110 is formed on the substrate 101. The first conductive semiconductor layer 110 may be selected from the compound semiconductors of group III-V elements (on which a first conductive dopant is doped), for example, GaN, AlN, AlGaN, InGaN, InN, InAlGaN, AlInN, AlGaAs, GaP, GaAs and GaAsP. When the first conductive semiconductor layer 110 is an N-type dopant, the first conductive dopant comprises an N-type dopant such as Si, Ge, Sn, Se and Te.

The active layer 120 is formed of a group III-V compound semiconductor on the first conductive semiconductor layer 110, and has a single quantum well structure or a multiple quantum well structure. The active layer 120 may comprise a material that emits a chromatic light such as a light having a blue wavelength, a light having a red wavelength and a light having a green wavelength. A conductive clad layer may be formed on and/or under the active layer 120 and may be formed in an AlGaN layer, but is not limited thereto.

The second conductive semiconductor layer 130 is formed on the active layer 120, and may be formed of at least one of the compound semiconductors of group III-V elements (on which a second conductive dopant is doped), for example, GaN, AlN, AlGaN, InGaN, InN, InAlGaN, AlInN, AlGaAs, GaP, GaAs and GaAsP. When the second conductive semiconductor layer 130 is a P-type semiconductor layer, the second conductive dopant may comprise a P-type dopant such as Mg and Ze.

A third conductive semiconductor layer, for example, an N-type semiconductor layer or a P-type semiconductor layer, may be formed on the second conductive semiconductor layer 130. Accordingly, the light emitting structure 135 may comprise at least one of an N—P junction structure, a P—N junction structure, an N—P—N junction structure and a P—N—P junction structure.

Figure 4:
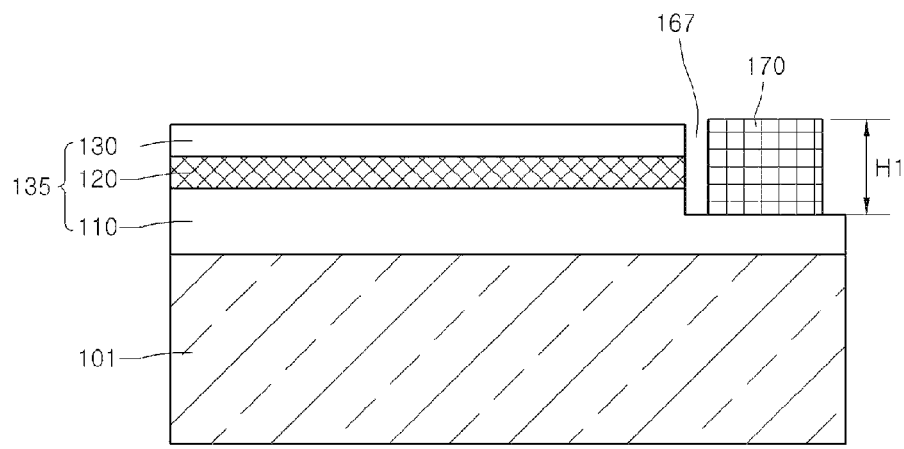

Referring to FIG. 4, the one-side region 167 of the second conductive semiconductor layer 110 is exposed in a first mesa etching process. Herein, the first mesa etching process is performed in a portion of the second conductive semiconductor layer 130 until the first conductive semiconductor layer 110 is exposed in a dry or/and wet etching process. The etching process may be changed in the spirit and scope of embodiments.

The first electrode 170 is formed in the one-side region 167 of the first conductive semiconductor layer 110. The first electrode 170 may be formed of at least one of Ti, Al, In, Ta, Pd, Co, Ni, Si, Ge, Ag and Au, but is not limited thereto. The one side of the first conductive semiconductor layer 110 contacts the bottom of the first electrode 170, and the size of the contacted region may be changed according to an etching region by the first mesa etching process.

Herein, the bottom of the first electrode 170 may be electrically connected to the first conductive semiconductor layer 110.

The thickness H1 of the first electrode 170 heightens or lowers the top of the second conductive semiconductor layer 130.

The first electrode 170 is separated from the second conductive semiconductor layer 130 and the side surface of the active layer 120 at a certain interval, and may be formed in a circle shape, a polygon shape or a line shape.

Figure 5:
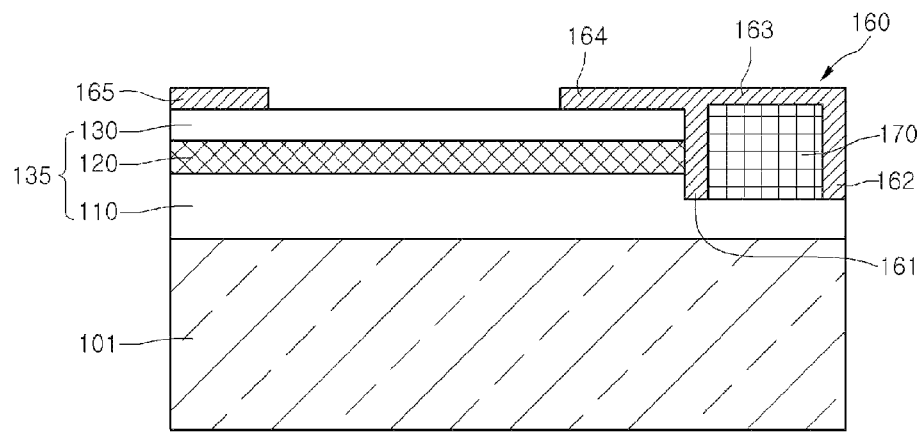

Referring to FIG. 5, the insulator 160 is formed in the outer surface and top of the first electrode 170. The insulator 160 comprises the side wall portions 161 and 162, the base portion 163 and the support portion 164, and covers the exposed region of the first electrode 170. The insulator 160 may be formed of at least one of $SiO_2$, $Si_3N_4$, $Al_2O_3$ and $TiO_2$.

The side wall portions 161 and 162 are formed in the outer surface of the first electrode 170. The inner side wall portion 161 insulates the inner side surface of the first electrode 170 and the first conductive semiconductor layer 110, and insulates the active layer 120 and the one side of the second conductive semiconductor layer 130. The outer side wall portion 162 insulates other side surface of the first electrode 170 in the channel region of the chip. Accordingly, the side wall portions 161 and 162 prevent the outer side of the first electrode 170 from being exposed.

The base portion 163 is formed in the top of the first electrode 170, and insulates the top of the first electrode 170. The support portion 164 extended to the inner side of the base portion 163 supports the entirety of the insulator 160.

The passivation portion 165 may be formed along the outer side of the top of the second conductive semiconductor layer 130. The passivation portion 165 has a ring shape or a belt shape, and may be connected to the base portion 163 of the insulator 160. The material of the passivation portion 165 may be the same as that of the insulator 160. That is, the insulator 160 may further comprise the passivation portion 165.

Moreover, the passivation portion 165 may be formed in a material different from the insulator 160, for example, a conductive material. For example, the passivation portion 165 may comprise at least one of ITO, IZO, AZO, IZTO, IAZO, IGZO, IGTO and ATO. The passivation portion 165 may not be formed.

Figure 6:
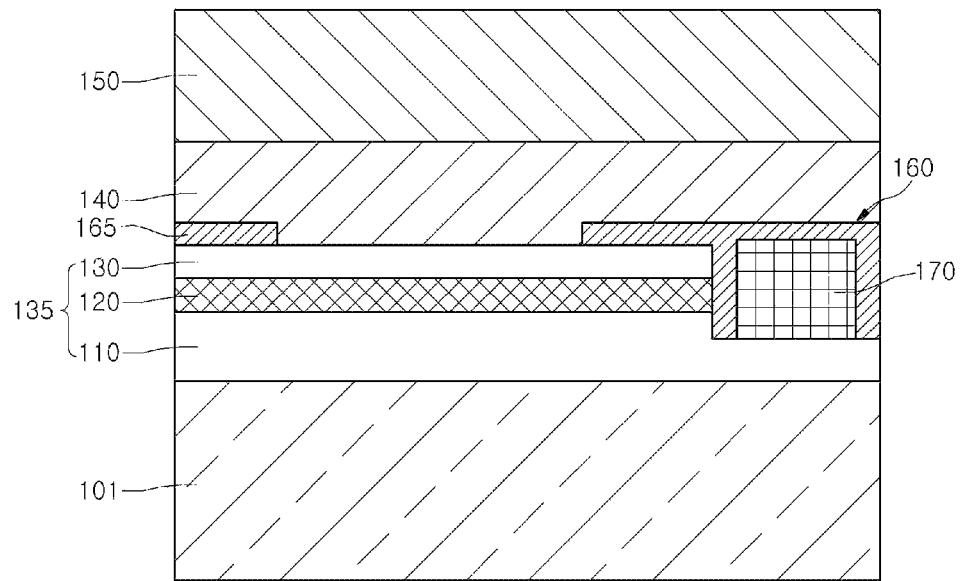

Referring to FIG. 6, the second electrode layer 140 is formed on the second conductive semiconductor layer 130 and the insulator 160, the conductive support member 150 is formed on the second electrode layer 140.

The passivation portion 165, which is disposed around the top of the second conductive semiconductor layer 130, separates the light emitting structure 135 from the second electrode layer 140, and thus, can prevent influences that are transferred from the second electrode layer 140 to the side wall of the light emitting structure 135.

The second electrode layer 140 may be formed of at least one of reflection electrode materials, for example, Ag, Ni, Al, Rh, Pd, Ir, Ru, Mg, Zn, Pt, Au, Hf and a material consisting of their selective combination. An ohmic contact layer (not shown), in which a plurality of patterns are formed in a matrix shape or/and a layer type, may be formed between the second electrode layer 140 and the second conductive semiconductor layer 130. The ohmic contact layer comprises at least one of materials such as ITO, IZO, AZO, IZTO, IAZO, IGZO, IGTO and ATO.

The second electrode layer 140 serves as an electrode which stably provides the power supply source having the second polarity to the light emitting structure 135. Herein, the second electrode layer 140 may be schottky/ohmic contacted to the second conductive semiconductor layer 130. When the ohmic contact layer exists, the ohmic contact layer and the second electrode layer 140 may divide a current applied to the second conductive semiconductor layer 130 because they have different electrical resistances.

The conductive support member 150 may be formed of at least one of Cu, Au, Ni, Mo, Cu—W and carrier wafer (for example, Si, Ge, GaAs, ZnO, SiC and the like). Herein, the second electrode layer 140, for example, may be formed in a sputtering process. The conductive support member 150, for example, may be formed in a plating process. The formation processes may be changed in the spirit and scope of embodiments.

Figure 7:
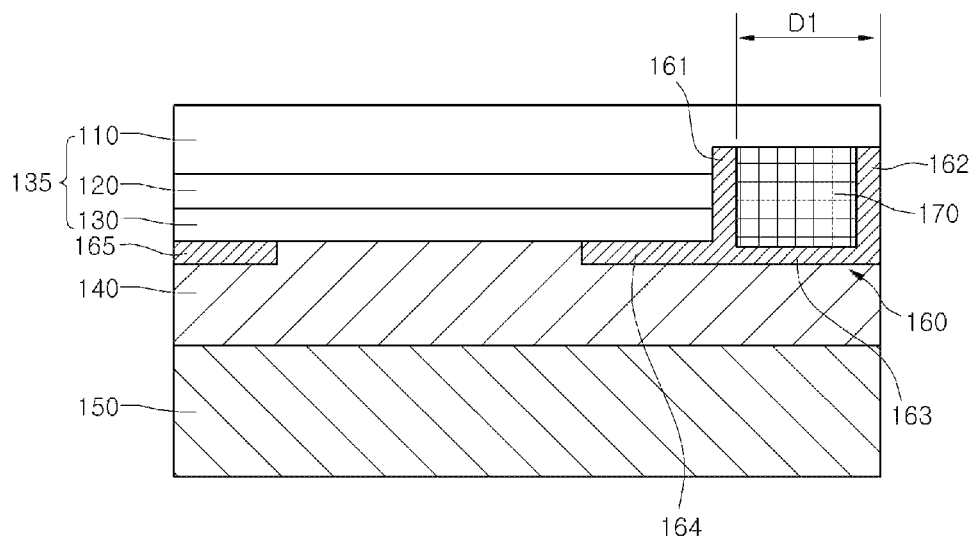

Referring to FIGS. 6 and 7, the substrate 101 is removed. In this case, the substrate 101 is disposed upward and is removed.

The substrate 101 that is disposed under the first conductive semiconductor layer 110 is removed in a physical/chemical process. For example, when laser ray having a wavelength of a certain region is irradiated to the substrate 101, a heating energy is concentrated on a boundary surface between the substrate 101 and the first conductive semiconductor layer 110, and thus the substrate 101 is separated. Furthermore, a polishing process using an Inductively coupled Plasma/Reactive Ion Etching (ICP/RCE) process may be performed on the surface of the first conductive semiconductor layer 110 from which the substrate 101 has been removed.

When a non-conductive semiconductor layer, for example, a buffer layer or/and an undoped semiconductor layer exists between the substrate 101 and the first conductive semiconductor layer 110, it may be removed in an etching process or a polishing process, but is not limited thereto.

Figure 8:
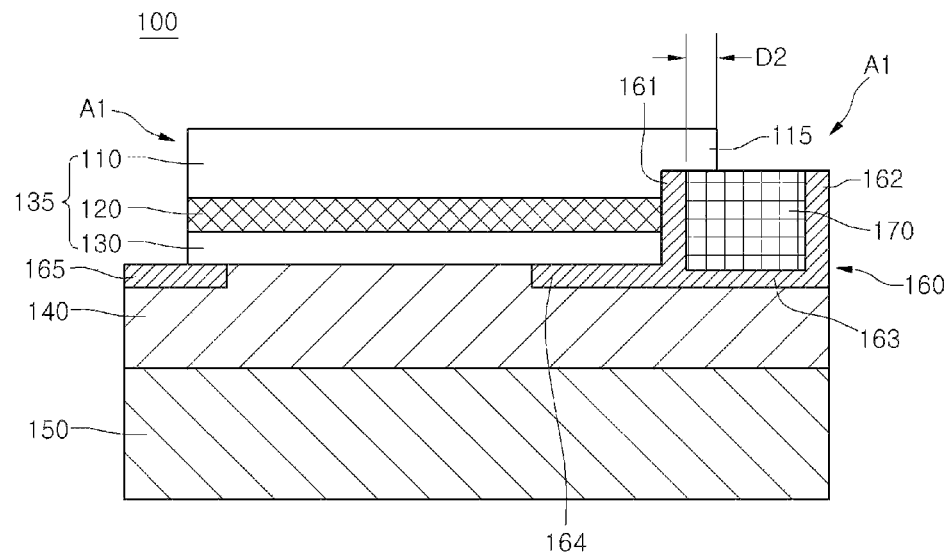

Referring to FIGS. 7 and 8, the one side of the first conductive semiconductor layer 110 is disposed on the first electrode 170 and the insulator 160.

A roughness (not shown) of a certain shape may be formed on the top of the first conductive semiconductor layer 110. Moreover, a translucent electrode layer (not shown) may be formed on the first conductive semiconductor layer 110, and may diffuse a current. The translucent electrode layer may comprise at least one of ITO, IZO, IZTO, IAZO, IGZO, IGTO, AZO, ATO, gallium zinc oxide (GZO), IrOx, RuOx, RuOx/ITO, Ni/IrOx/Au and Ni/IrOx/Au/ITO.

A second mesa etching process is performed on the light emitting structure 135. In this case, an etched region A1 exists in the outer perimeter of the light emitting structure 135, which is disposed more inward than the edge of the second electrode layer 140. Herein, the region A1 may not exist.

The second mesa etching process may use a wet or/and dry etching process, and may be changed in the spirit and scope of embodiments.

When the second mesa etching process is performed in a portion of the one-side region D1 of the first conductive semiconductor layer 110, the top of the first electrode 170 is exposed in the one side of the first conductive semiconductor layer 110.

Since the certain region D2 of the first conductive semiconductor layer 110 is disposed to overlap on the first electrode 170, the first electrode 170 is electrically connected to the one end 115 of the first conductive semiconductor layer 110.

In the semiconductor light emitting device 100, the first electrode 170 is disposed in the side direction of the first conductive semiconductor layer 110, and a wire bonded to the first electrode 170 may be disposed in the outer side of the semiconductor light emitting device 100. Accordingly, the light extraction efficiency of the semiconductor light emitting device 100 can be improved.

Figure 9:
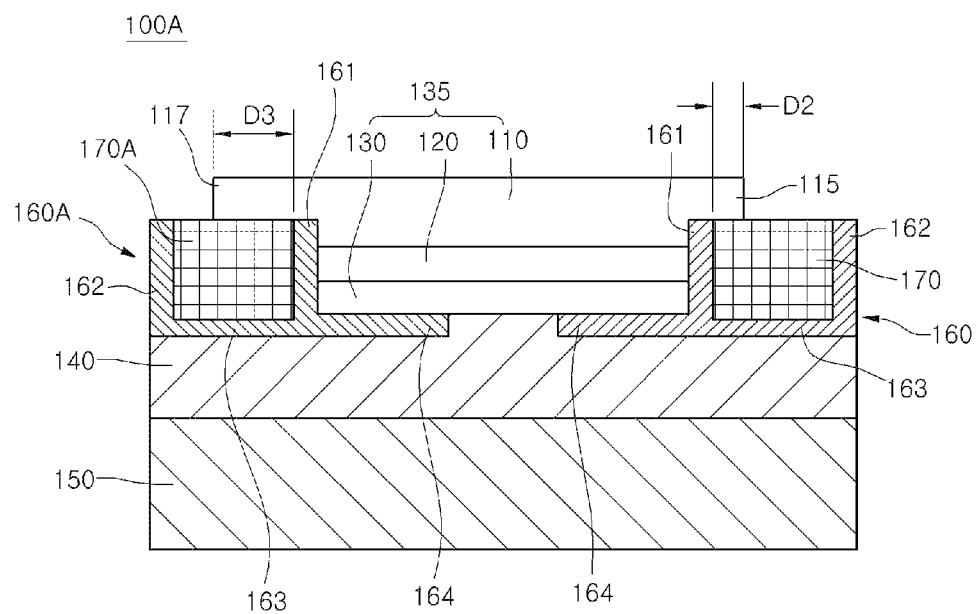
FIG. 9 is a side-sectional view of a semiconductor light emitting device according to another embodiment.

FIG. 9 is a side-sectional view of a semiconductor light emitting device according to another embodiment. In description of another embodiment, repetitive description on the same elements as those of one embodiment will be omitted and refers to that of one embodiment.

Referring to FIG. 9, a semiconductor light emitting device 100A according to another embodiment comprises the first conductive semiconductor layer 110, the active layer 120, the second conductive semiconductor layer 130, the second electrode layer 140, the conductive support member 150, a plurality of insulators 160 and 160A, and a plurality of first electrodes 170 and 170A.

The plurality of insulators 160 and 160A are disposed in the both sides of the light emitting structure 135 respectively, and electrically insulate the first electrodes 170 and 170A and the layers 120, 130 and 140. A detailed description on the insulators 160 and 160A refers to one embodiment.

In the plurality of first electrodes 170 and 170A, regions D2 and D3 where the one side 115 and other side 117 of the first conductive semiconductor layer 110 overlap may be identical to or different from each other.

The plurality of first electrodes 170 and 170A may be electrically connected by an electrode pattern formed on the first conductive semiconductor each other.

In the semiconductor light emitting device 100A, the first electrodes 170 and 170A are disposed in the both-side directions of the first conductive semiconductor layer 110 respectively, and a plurality of wires bonded to the first electrodes 170 and 170A may be disposed in the outer side of the semiconductor light emitting device 100A. Accordingly, the light extraction efficiency of the semiconductor light emitting device 100A can be improved.

Embodiments dispose the first electrode in the outer side of the plurality of compound semiconductor layers, thereby solving light absorption limitations due to the first electrode and the wire.

Embodiments can improve light efficiency.

Embodiments can improve the reliability of the semiconductor light emitting device.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A semiconductor light emitting device, comprising:
a reflective electrode layer;
a second conductive semiconductor layer formed on a portion of a top surface of the reflective electrode layer;
an active layer formed on the second conductive semiconductor layer and having a quantum well structure;
a first conductive semiconductor layer formed on the active layer;
a first electrode formed under one portion of the first conductive semiconductor layer, the first electrode being adjacent to the second conductive semiconductor layer, the active layer and a portion of a side surface of the first conductive semiconductor layer; and
an insulating layer having a lower portion, and a side wall portion extended from the lower portion into the first conductive semiconductor layer,
wherein the lower portion is horizontally disposed on the reflective electrode layer, comprising a first portion between the second conductive semiconductor layer and the reflective electrode layer, a second portion under the side wall portion, and a third portion under the first electrode, and
wherein the insulating layer is configured to insulate the first electrode from the reflective electrode layer, the second conductive semiconductor layer and the active layer.

2. The semiconductor light emitting device of claim 1, wherein the side wall portion extends vertically upward.

3. The semiconductor light emitting device of claim 1, wherein the active layer intersects with the side wall portion.

4. The semiconductor light emitting device of claim 1, wherein the side wall portion extends from the lower portion to an uppermost side portion of the first electrode.

5. The semiconductor light emitting device of claim 1, further comprising:
a conductive support member formed under the reflective electrode layer.

6. The semiconductor light emitting device of claim 1, wherein the second conductive semiconductor layer includes a p-type semiconductor layer and the first conductive semiconductor layer includes an n-type semiconductor layer.

7. The semiconductor light emitting device of claim 1, wherein the second conductive semiconductor layer includes multiple p-type semiconductor layers.

8. The semiconductor light emitting device of claim 1, wherein the active layer includes a multiple quantum well structure.

9. The semiconductor light emitting device of claim 1, further comprising:
a roughness having a certain shape included on a surface of the first semiconductor layer.

10. The semiconductor light emitting device of claim 9, wherein the entire surface of the first semiconductor layer includes the roughness having the certain shape.

11. The semiconductor light emitting device of claim 1, wherein one portion of a top surface of the first electrode is directly contacted with one portion of a lower surface of the first conductive semiconductor layer, and another portion of the top surface of the first electrode is not in contact with the first conductive semiconductor layer.

12. The semiconductor light emitting device of claim 1, further comprising:
a conductive clad layer formed on or under the active layer.

13. The semiconductor light emitting device of claim 12, wherein the conductive clad layer includes AlGaN.

14. The semiconductor light emitting device of claim 1, wherein the first portion of the lower portion between the second conductive semiconductor layer and the reflective electrode layer has a uniform thickness.

15. The semiconductor light emitting device of claim 1, wherein the first electrode comprises at least one selected from the group consisting of Ti, Al, In, Ta, Pd, Co, Ni, Si, Ge, Ag and Au.

16. The semiconductor light emitting device of claim 1, wherein the first electrode is disposed on the third portion of the lower portion and surrounded by the side wall portion.

17. The semiconductor light emitting device of claim 1, wherein the first electrode is formed in a circle shape, a polygon shape or a line shape.

18. The semiconductor light emitting device of claim 1, wherein a portion of the first electrode is bonded to a wire.

19. The semiconductor light emitting device of claim 18, wherein the portion of the first electrode bonded to the wire is disposed in an outer side of the light emitting structure, and wherein the light emitting structure includes the first conductive semiconductor layer, the active layer, and the second conductive semiconductor layer.

\* \* \* \* \*